(12) United States Patent
Lubomirsky et al.

(10) Patent No.: US 8,937,800 B2
(45) Date of Patent: Jan. 20, 2015

(54) ELECTROSTATIC CHUCK WITH ADVANCED RF AND TEMPERATURE UNIFORMITY

(71) Applicants: Dmitry Lubomirsky, Cupertino, CA (US); Jennifer Y. Sun, Mountain View, CA (US); Mark Markovsky, San Jose, CA (US); Konstantin Makhratchev, Fremont, CA (US); Douglas A. Buchberger, Jr., Livermore, CA (US); Samer Banna, San Jose, CA (US)

(72) Inventors: Dmitry Lubomirsky, Cupertino, CA (US); Jennifer Y. Sun, Mountain View, CA (US); Mark Markovsky, San Jose, CA (US); Konstantin Makhratchev, Fremont, CA (US); Douglas A. Buchberger, Jr., Livermore, CA (US); Samer Banna, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 45 days.

(21) Appl. No.: 13/867,515

(22) Filed: Apr. 22, 2013

(65) Prior Publication Data

US 2013/0279066 A1 Oct. 24, 2013

Related U.S. Application Data

(60) Provisional application No. 61/637,500, filed on Apr. 24, 2012, provisional application No. 61/775,372, filed on Mar. 8, 2013.

(51) Int. Cl.
*H02N 13/00* (2006.01)
*H01L 21/67* (2006.01)

(52) U.S. Cl.
CPC .......... *H02N 13/00* (2013.01); *H01L 21/67103* (2013.01)
USPC ........................................................ 361/234

(58) Field of Classification Search
CPC .......................... H02N 13/00; H01L 21/67103

USPC ......................................................... 361/234
See application file for complete search history.

(56) References Cited

U.S. PATENT DOCUMENTS

| 2005/0173404 A1* | 8/2005 | Benjamin et al. .......... 219/444.1 |
| 2006/0102613 A1* | 5/2006 | Kuibira et al. ............. 219/444.1 |

(Continued)

FOREIGN PATENT DOCUMENTS

| JP | 2007317772 A | * 12/2007 |
| JP | 2009-152475 | 7/2009 |

(Continued)

OTHER PUBLICATIONS

International Search Report and Written Opinion from PCT/US2013/037849 mailed Aug. 12, 2013, 10 pgs.

*Primary Examiner* — Scott Bauer
(74) *Attorney, Agent, or Firm* — Blakely Sokoloff Taylor Zafman LLP (57) ABSTRACT

Electrostatic chucks (ESCs) with RF and temperature uniformity are described. For example, an ESC includes a top dielectric layer. An upper metal portion is disposed below the top dielectric layer. A second dielectric layer is disposed above a plurality of pixilated resistive heaters and surrounded in part by the upper metal portion. A third dielectric layer is disposed below the second dielectric layer, with a boundary between the third dielectric layer and the second dielectric layer. A plurality of vias is disposed in the third dielectric layer. A bus power bar distribution layer is disposed below and coupled to the plurality of vias. A fourth dielectric layer is disposed below the bus bar power distribution layer, with a boundary between the fourth dielectric layer and the third dielectric layer. A metal base is disposed below the fourth dielectric layer. The metal base includes a plurality of high power heater elements housed therein.

20 Claims, 8 Drawing Sheets

(56) References Cited

U.S. PATENT DOCUMENTS

2009/0002913 A1 1/2009 Naim
2011/0092072 A1* 4/2011 Singh et al. ............... 438/710
2013/0220575 A1* 8/2013 Ptasienski et al. .............. 165/61

FOREIGN PATENT DOCUMENTS

| KR | 1020050041926 | 5/2005 |
| KR | 1020070050111 | 5/2007 |
| KR | 1020090048449 | 5/2009 |

* cited by examiner

ELECTROSTATIC CHUCK WITH ADVANCED RF AND TEMPERATURE UNIFORMITY

CROSS-REFERENCE TO RELATED APPLICATIONS

This application claims the benefit of U.S. Provisional Application No. 61/637,500, filed Apr. 24, 2012, and U.S. Provisional Application No. 61/775,372, filed Mar. 8, 2013, the entire contents of which are hereby incorporated by reference herein.

BACKGROUND

1) Field

Embodiments of the present invention pertain to the field of semiconductor processing equipment and, in particular, to electrostatic chucks with advanced RF and temperature uniformity, and methods of fabricating such electrostatic chucks.

2) Description of Related Art

In a plasma processing chamber, such as a plasma etch or plasma deposition chamber, the temperature of a chamber component is often an important parameter to control during a process. For example, a temperature of a substrate holder, commonly called a chuck or pedestal, may be controlled to heat/cool a workpiece to various controlled temperatures during the process recipe (e.g., to control an etch rate). Similarly, a temperature of a showerhead/upper electrode, chamber liner, baffle, process kit, or other component may also be controlled during the process recipe to influence the processing. Conventionally, a heat sink and/or heat source is coupled to the processing chamber to maintain the temperature of a chamber component at a desired temperature. Often, at least one heat transfer fluid loop thermally coupled to the chamber component is utilized to provide heating and/or cooling power.

Long line lengths in a heat transfer fluid loop, and the large heat transfer fluid volumes associated with such long line lengths are detrimental to temperature control response times. Point-of-use systems are one means to reduce fluid loop lengths/volumes. However, physical space constraints disadvantageously limit the power loads of such point-of-use systems.

With plasma processing trends continuing to increase RF power levels and also increase workpiece diameters (with 300 mm now typical and 450 mm systems now under development), temperature and/or RF control and distribution addressing both a fast response time and high power loads is advantageous in the plasma processing field.

DETAILED DESCRIPTION

Electrostatic chucks with advanced RF and temperature uniformity, and methods of fabricating such electrostatic chucks, are described. In the following description, numerous specific details are set forth, such as specific chuck material regimes, in order to provide a thorough understanding of embodiments of the present invention. It will be apparent to one skilled in the art that embodiments of the present invention may be practiced without these specific details. In other instances, well-known aspects, such as etch processing in the presence of a wafer supported by a chuck, are not described in detail in order to not unnecessarily obscure embodiments of the present invention. Furthermore, it is to be understood that the various embodiments shown in the Figures are illustrative representations and are not necessarily drawn to scale.

One or more embodiments described herein relate to electrostatic chucks with advanced RF and temperature uniformity or systems including electrostatic chucks with advanced RF and temperature uniformity.

To provide context, wafer clamping by means of electrostatic chucking has been used to provide temperature control during etch processing. The wafer is clamped to ceramic, or multi-layer surface with heat sink or heater (or both) depending on application. Due to inherent non-uniformities and auxilary hardware (e.g., lifter pins, RF/DC electrodes, etc.) the ceramic surface temperature is not uniform. This non-uniformity translates to the wafer, affecting the etch process. Conventional chuck designs have concentrated on coolant layout optimization and introduction of multiple (up to 4 zones) heaters. Such chuck designs have not been useful for solving issue related to, or caused by, auxiliary hardware (e.g., lifter pins, RF/DC electrodes, etc.).

In an embodiment, in order to address the above described issues with conventional approaches, next generation (beyond 4-zone) etch chamber ESC with extreme temperature uniformity is described. In an embodiment, as described in greater detail below, a chuck described herein can achieve thermal requirements including one or more of $Al_2O_3$-based 12 inch puck, a temperature capability up to 130 C, temperature uniformity ≤0.5 C at 65/65/45 degrees Celsius with plasma. Embodiments described herein may be directed to next generation etch chamber ESCs with active temperature control.

FIGS. 1-5A and 5B depict electrostatic (ESC) structures, or portions thereof, in accordance with various embodiments of the present invention.

Figure 1:
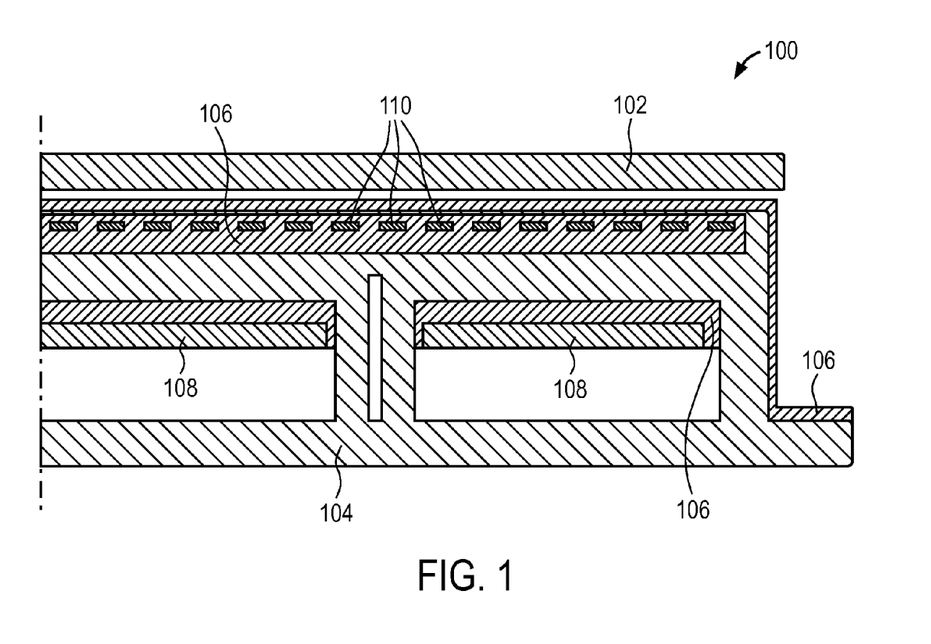
FIG. 1 illustrates a cross-sectional view of a portion of an electrostatic chuck (ESC) configured to support a wafer or substrate, in accordance with an embodiment of the present invention.

Referring to FIG. 1, an ESC 100 is configured to support a wafer or substrate 102. A framework 104 of the ESC may be composed of, e.g., aluminum. A plasma spray coat layer 106, e.g., a ceramic layer, is included on various surfaces of the framework 104. Main heaters 108 are included, along with auxiliary heaters 110.

Figure 2:
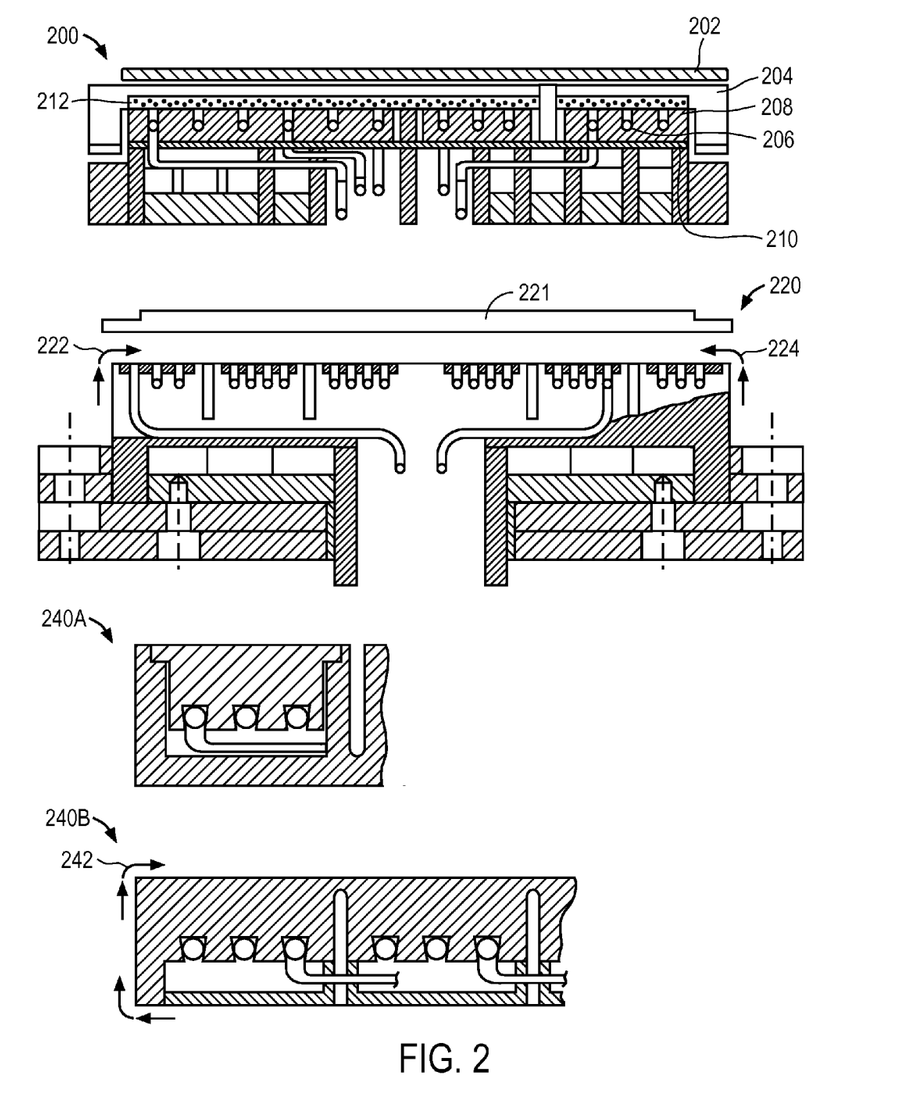
FIG. 2 illustrates cross-sectional views of portions of various electrostatic chucks configured to support a wafer or substrate, in accordance with another embodiment of the present invention.

Referring to FIG. 2, an ESC portion 200, as shown from a cross-sectional perspective, is configured to support a wafer or substrate 202. A ceramic layer 204, on which a wafer or substrate 202 is to reside, is disposed on a plurality of resistive heater elements 206, e.g., and held in place by an adhesive layer 208. A metal base 210 supports the plurality of resistive heater elements 206 and may be RF hot. An optional chucking electrode 212 may also be included, as depicted in FIG. 2.

Referring again to FIG. 2, a portion 220 of an ESC having a solid ceramic plate 221, as shown from a cross-sectional perspective, is provided to demonstrate RF pathways 222 and 224 within an ESC. An RF pathway 242 is further demonstrated in portion 240B of an ESC (which can also be configured as shown as 240A), as is also shown from a cross-sectional perspective in FIG. 2. It is to be understood that in some embodiments, the shown ESC portions 220, 240A and 240B can be configured with a solid ceramic plate-only arrangement (as shown) or can include a plasma spray coat layer on which the solid ceramic plate is adhered, as described in greater detail below in association with FIG. 5B.

Figure 3:
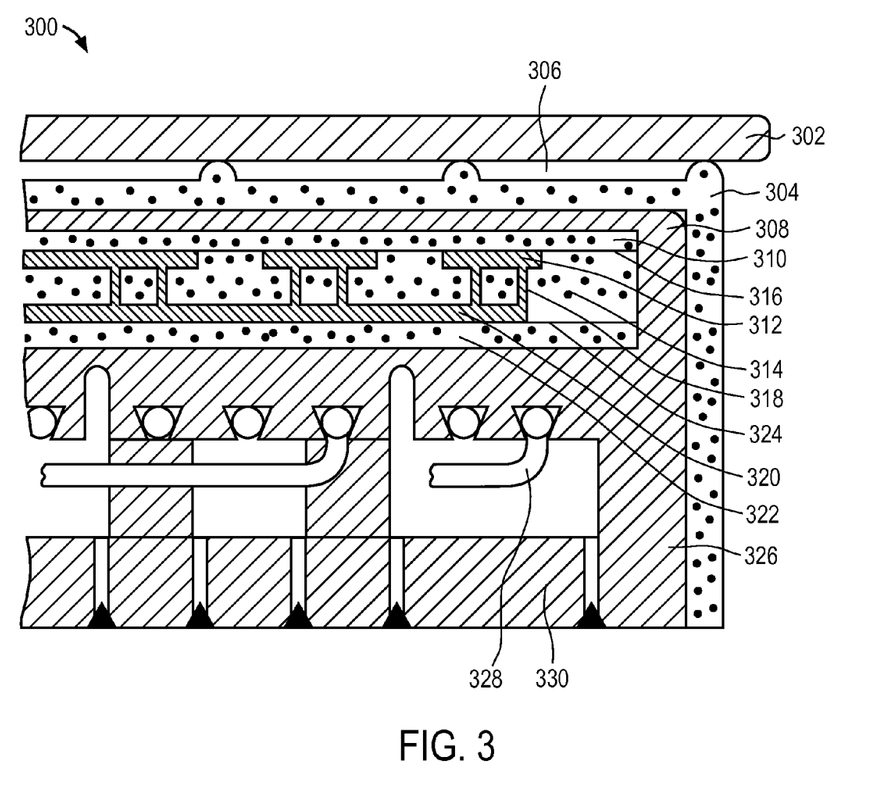
FIG. 3 illustrates a cross-sectional view of a portion of an electrostatic chuck configured to support a wafer or substrate, in accordance with another embodiment of the present invention.

Referring to FIG. 3, an ESC 300, as shown from a cross-sectional perspective, is configured to support a wafer or substrate 302. A dielectric layer 304, e.g., a plasma spray dielectric layer, provides a support on which a wafer or substrate 302 is to reside. Open regions 306 provide cooling channels, e.g., for backside helium (He) cooling. The dielectric layer 304 is disposed above an upper metal portion 308, e.g., which can provide a guide for RF waves. A dielectric layer 310, e.g., a plasma spray or arc oxidation layer, is disposed above a plurality of pixilated resistive heaters 312 and is surrounded in part by the upper metal portion 308. An additional dielectric layer 314 is disposed below the dielectric layer 310, with a boundary 316 between the dielectric layer 314 and the dielectric layer 310. Vias 318 are included to couple the plurality of pixilated resistive heaters 312 with a bus bar power distribution layer 320. A dielectric layer 322 is disposed below the bus bar power distribution layer 320, with a boundary 324 between the dielectric layer 314 and the dielectric layer 322. The above features are disposed above a metal base 326. The metal base 326 houses high power heater elements or boosters 328. A welded bottom plate 330 may also be included, as depicted in FIG. 3.

In accordance with an embodiment of the present invention, an electrostatic chuck (ESC) has 1 or more (up to 8) main heaters to provide baseline temperature control. To provide fine-tuning of temperature distribution, a large number of auxiliary heaters is placed near ESC surface. To reduce RF-related uniformity, all heaters are positioned inside aluminum cage, which acts as RF shield and RF delivery path at the same time. Thus, in an embodiment, etch processing with improved RF uniformity and/or improved temperature uniformity can be achieved.

In a particular embodiment, a chuck described herein can achieve temperature uniformity requirements including one or more of: (1) for heater layout: RF coupling, process temperature ramp between steps, addressed with 4-zone heater design; (2) for tool matching: subtle variations in conventional ESC/showerhead/edge HW results in localized hot/cold spots and a multi-array, from 45 up to 169 equalization heaters are otherwise needed to match tool-to-tool temperature uniformity.

In an embodiment, the ESC 300 described in association with FIG. 3 may be manufactured by first installing the high power heater elements or boosters 328 into the metal base 326. The bottom plate 330 is then welded into place. The dielectric layer 322 is then deposited by, e.g., plasma spray or arc anodizing approaches. A metal layer is then formed, e.g., by screen printing, to provide bus bar power distribution layer 320 which can deliver current to the pixilated resistive heaters 312. The dielectric layer 314 is then deposited, covering the dielectric layer 324. Via holes are then formed in the dielectric layer 314, exposing the bus bar power distribution layer 320. Metal deposition is then performed to fill the via holes, forming vias 318. Alternatively, the vias 318 may be filled while forming the pixilated resistive heaters 312. Dielectric layer 310 is then deposited, followed by deposition of the upper metal portion 308. The upper metal portion 308 is formed to provide edges of a metal base. Dielectric layer 304 is then formed to cover all of the above described layers. Optionally, features may be machined into the dielectric layer 304 to tailor the wafer interface with ESC 300.

Figure 4:
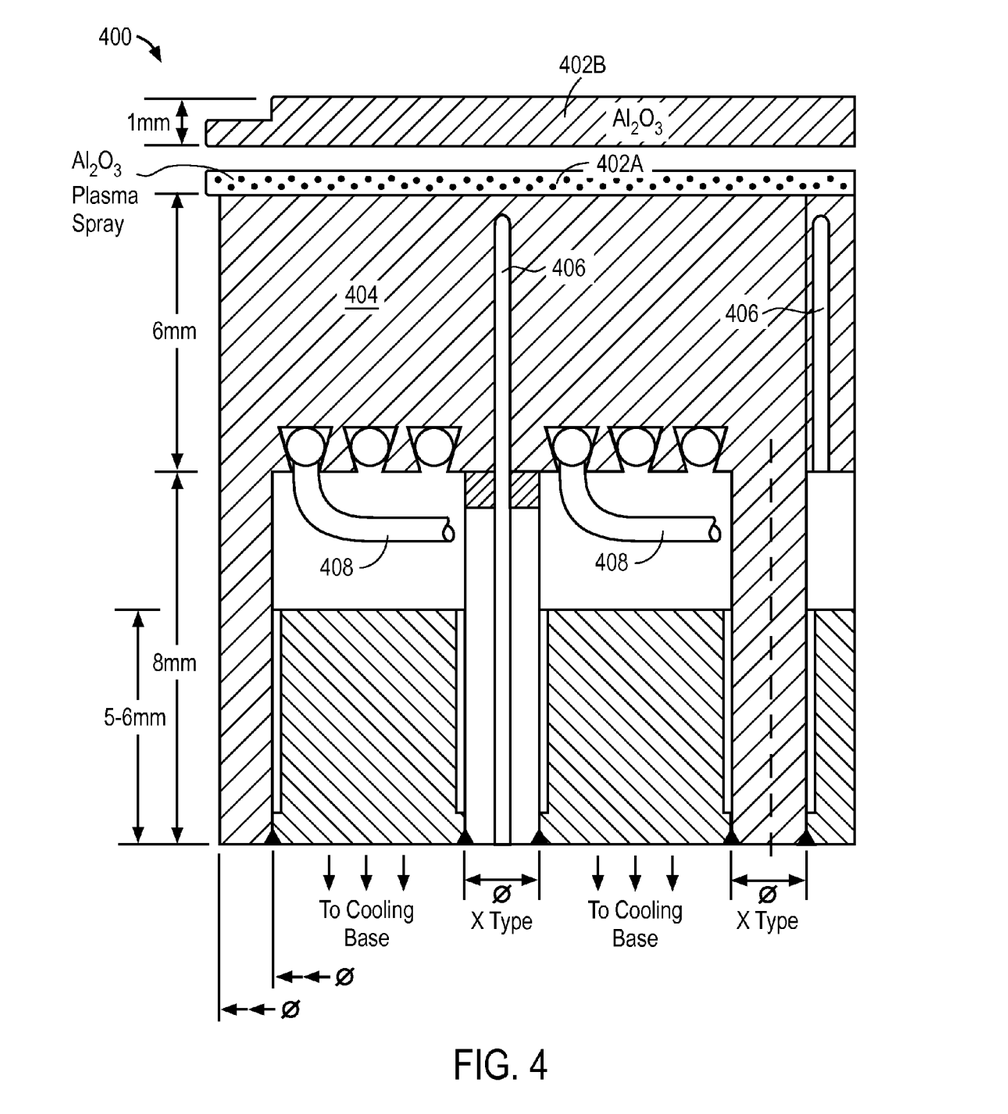
FIG. 4 illustrates a cross-sectional view of a portion of an electrostatic chuck configured to support a wafer or substrate, in accordance with another embodiment of the present invention.

Referring to FIG. 4, an ESC portion 400, as shown from a cross-sectional perspective, is configured to support a wafer or substrate. A top dielectric layer or feature of ESC 400 may be provided by, e.g., including a deposited dielectric layer (e.g., $Al_2O_3$) 402A, e.g., by plasma spray. Alternatively, or in addition to, a dielectric plate 402B, such as an $Al_2O_3$ plate, may be included. Both options are depicted in FIG. 4. A metal base 404, such as an aluminum (Al) base, is included beneath the dielectric layer 402A and/or the dielectric plate 402B. Slots 406 may be included in the metal base 404 to provide a thermal break. Cable heaters 408 are housed in the metal base 404. The metal base 404 may further include pathways to a cooling base, as depicted in FIG. 4.

Figure 5A:
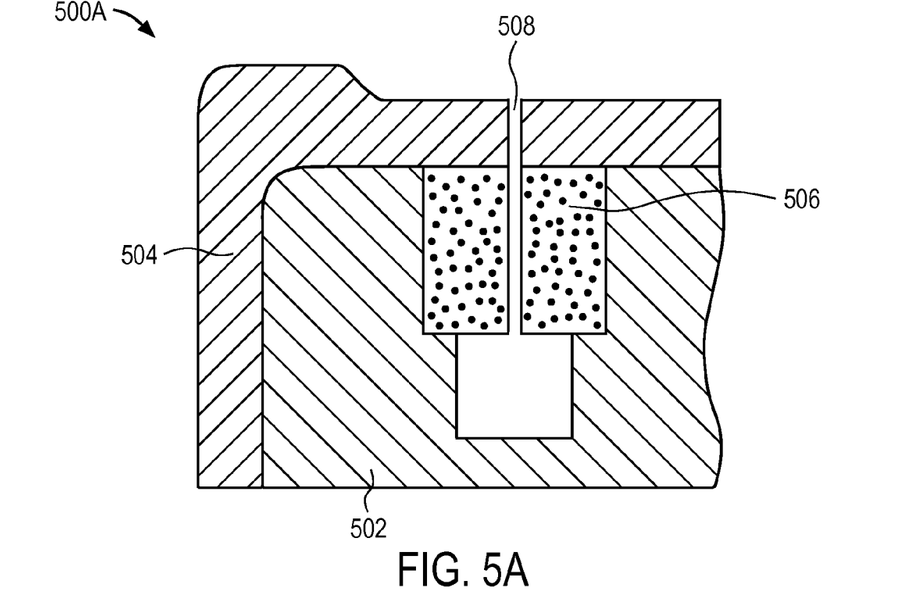
FIG. 5A illustrates a cross-sectional view of a portion of an electrostatic chuck configured to support a wafer or substrate, highlighting a plasma spray arrangement, in accordance with another embodiment of the present invention.

FIG. 5A depicts an ESC portion 500A, as shown from a cross-sectional perspective, highlighting the plasma spray configuration, in accordance with an embodiment of the present invention. ESC portion 500A includes a metal base portion 502, such as an aluminum base, with a plasma spray dielectric layer 504 disposed thereon. The plasma spray layer may be composed of a dielectric material such as, but not limited to, alumina ($Al_2O_3$), yttrium oxide ($Y_2O_3$) or a high performance material (HPM). A porous plug 506 is disposed in the metal base portion 502 and provides a pathway 508 for wafer or substrate cooling, e.g., by helium flow. The pathway 508 is disposed through the plasma spray dielectric layer 504.

Figure 5B:
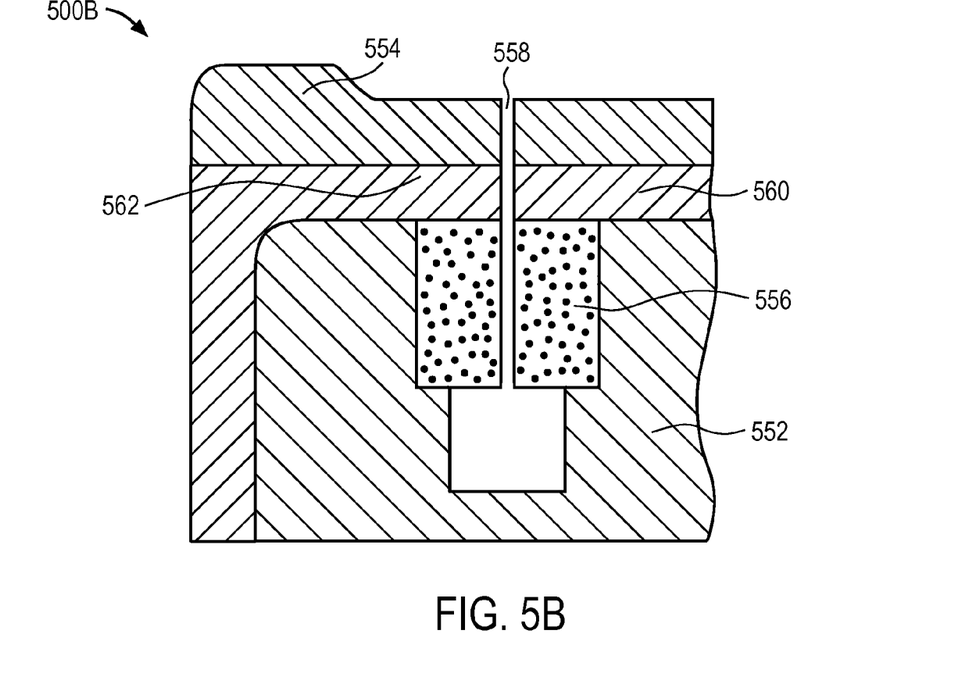
FIG. 5B illustrates a cross-sectional view of a portion of an electrostatic chuck configured to support a wafer or substrate, highlighting a solid ceramic top arrangement, in accordance with another embodiment of the present invention.

FIG. 5B depicts an ESC portion 500B, as shown from a cross-sectional perspective, highlighting the solid ceramic top configuration, in accordance with an embodiment of the present invention. ESC portion 500B includes a metal base portion 552, such as an aluminum base. A solid ceramic top 554 (such as an $Al_2O_3$ plate) is disposed above the metal base portion 552. In one embodiment, the solid ceramic top 554 is disposed above a plasma spray dielectric layer 560, as depicted in FIG. 5B. The plasma spray layer 560 may be composed of a dielectric material such as, but not limited to, alumina ($Al_2O_3$), yttrium oxide ($Y_2O_3$) or a high performance material (HPM). In that embodiment, the solid ceramic top 554 may be coupled to the plasma spray dielectric layer 560 by an adhesive layer 562. A porous plug 556 is disposed in the metal base portion 552 and provides a pathway 558 for wafer or substrate cooling, e.g., by helium flow. The pathway 558 is disposed through the solid ceramic top 554 and, if present, the plasma spray dielectric layer 560.

In an embodiment, mechanical aspects of a chuck described herein include the ESC itself, a cathode assembly redesign for additional 24-26 filters, electrical, RF filters, power delivery to auxiliary heaters. In an embodiment, commutation/switching logic aspects of a chuck described herein include interface with existing hardware. In an embodiment, software aspects of a chuck described herein include interface with I-4 temperature data, and/or communication with electrical subassembly. In an embodiment, a main heater for a chuck described herein includes a dual-zone heater. In an embodiment, a power requirement for a chuck described herein is addressed with auxiliary heaters.

In an embodiment, ESC type aspects of a chuck described herein include one or more of, coulombic, approximately 92% alumina composition, thin ceramic, possibly swappable/consumable, grounded cooling plates with RF-hot clamp electrode and/or printed RF electrode. In an embodiment, a spec for max RF power is approximately 2 kW max and approximately 13.56 MHz. In an embodiment, a spec for max helium pressure is approximately 10 Torr. In an embodiment, the RF current limitations are quantified for pin-to-electrode interface of approximately 20 A per pin. In an embodiment, inner/outer heater resistance is approximately at 90 C, 130 C, 25 A, 160V, 150 C (inner) 13 A, 150V, 150 C (outer).

Figure 6:
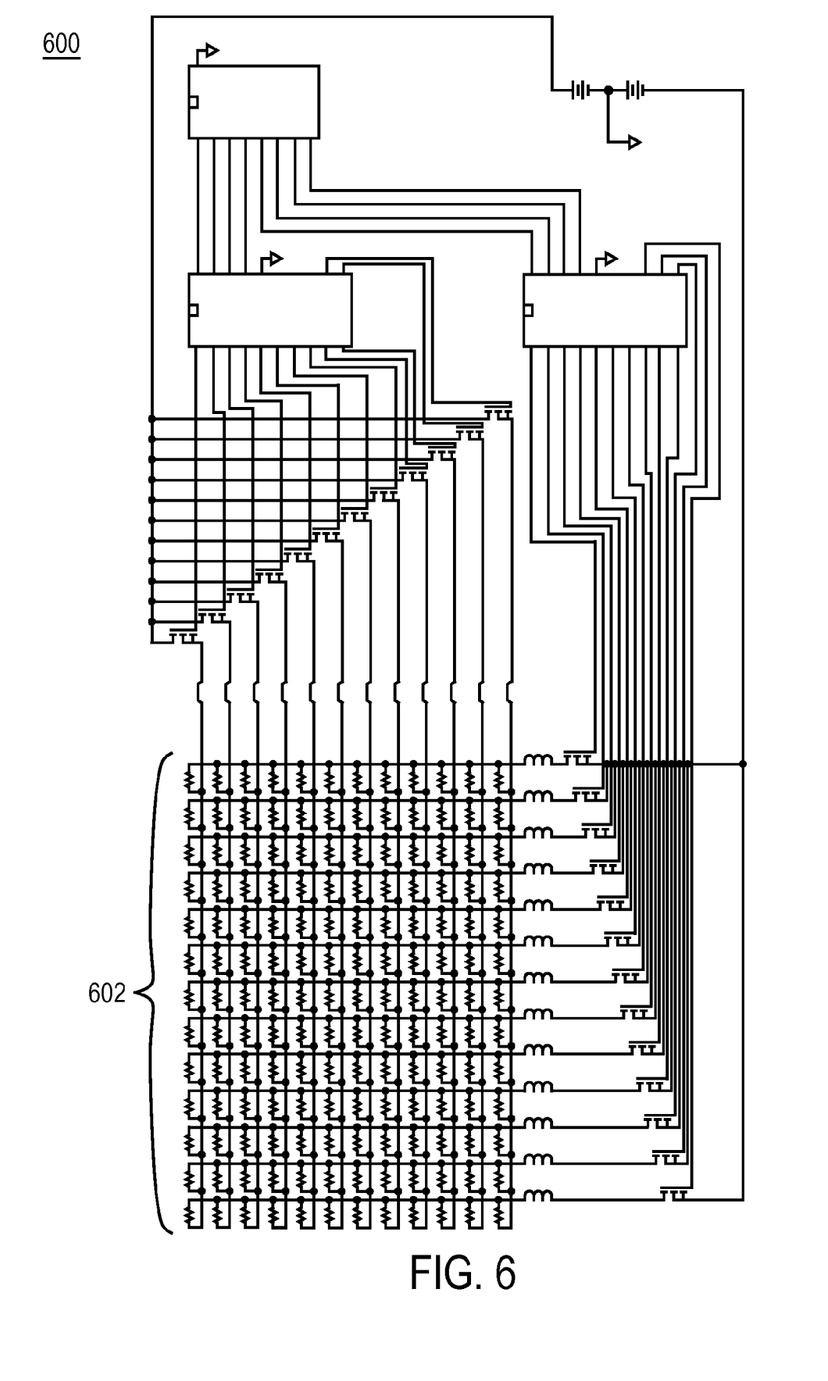
FIG. 6 is an electrical block-diagram including a 12×13 configuration of resistive auxiliary heaters for an electrostatic chuck (ESC), in accordance with various embodiments of the present invention.

In an embodiment, auxiliary heaters for a chuck described herein include approximately 45 heaters, and up to 144-169 (12×12 or 13×13 configuration). An estimated power for the heaters at approximately 92% alumina, min localized 1 C heating, max 4° C. heating and 45 heaters is approximately 3 W for 6° C. delta between heaters (4 W hi-purity). In an embodiment, feedback includes 2 sensors for dual-zone main heaters. In an embodiment, RF filtering is based on 3 W average per heater, DC 294V, 1.75 Amp total for 169 heaters (~168Ω). As an example, FIG. 6 is an electrical block-diagram 600, in accordance with an embodiment of the present invention. Referring to FIG. 6, a 12×13 configuration 602 of resistive auxiliary heaters is provided as an example.

An electrostatic chuck with advanced RF and temperature uniformity may be included in processing equipment suitable to provide an etch plasma in proximity to a sample for etching. For example, FIG. 7 illustrates a system in which an electrostatic chuck with advanced RF and temperature uniformity can be housed, in accordance with an embodiment of the present invention.

Figure 7:
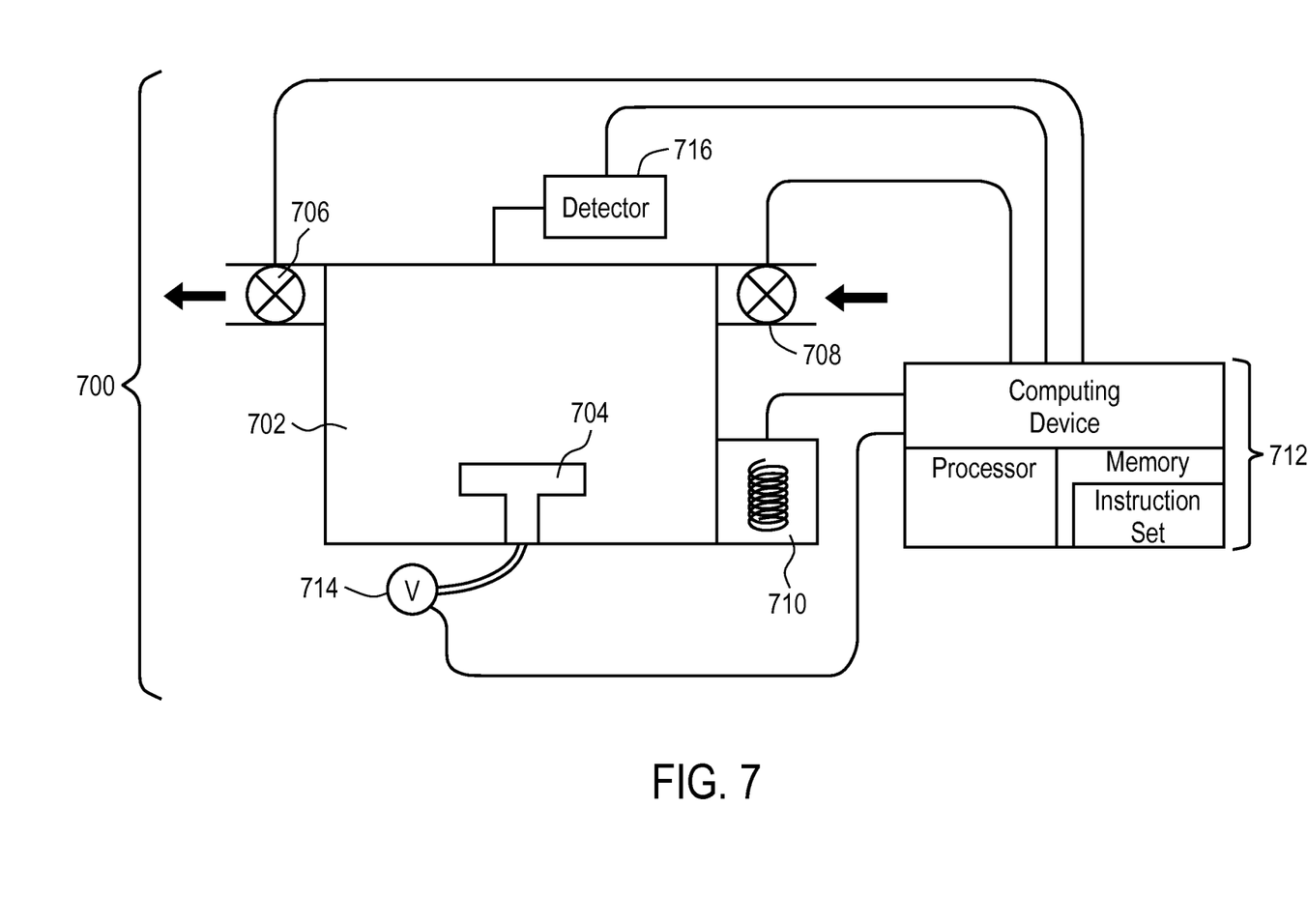
FIG. 7 illustrates a system in which an electrostatic chuck with advanced RF and temperature uniformity can be housed, in accordance with an embodiment of the present invention.

Referring to FIG. 7, a system 700 for conducting a plasma etch process includes a chamber 702 equipped with a sample holder 704. An evacuation device 706, a gas inlet device 708 and a plasma ignition device 710 are coupled with chamber 702. A computing device 712 is coupled with plasma ignition device 710. System 700 may additionally include a voltage source 714 coupled with sample holder 704 and a detector 716 coupled with chamber 702. Computing device 712 may also be coupled with evacuation device 706, gas inlet device 708, voltage source 714 and detector 716, as depicted in FIG. 7.

Chamber 702 and sample holder 704 may include a reaction chamber and sample positioning device suitable to contain an ionized gas, i.e. a plasma, and bring a sample in proximity to the ionized gas or charged species ejected there from. Evacuation device 706 may be a device suitable to evacuate and de-pressurize chamber 702. Gas inlet device 708 may be a device suitable to inject a reaction gas into chamber 702. Plasma ignition device 710 may be a device suitable for igniting a plasma derived from the reaction gas injected into chamber 702 by gas inlet device 708. Detection device 716 may be a device suitable to detect an end-point of a processing operation. In one embodiment, system 700 includes a chamber 702, a sample holder 704, an evacuation device 706, a gas inlet device 708, a plasma ignition device 710 and a detector 716 similar to, or the same as, a Conductor etch chamber or related chambers used on an Applied Materials® AdvantEdge system.

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 8:
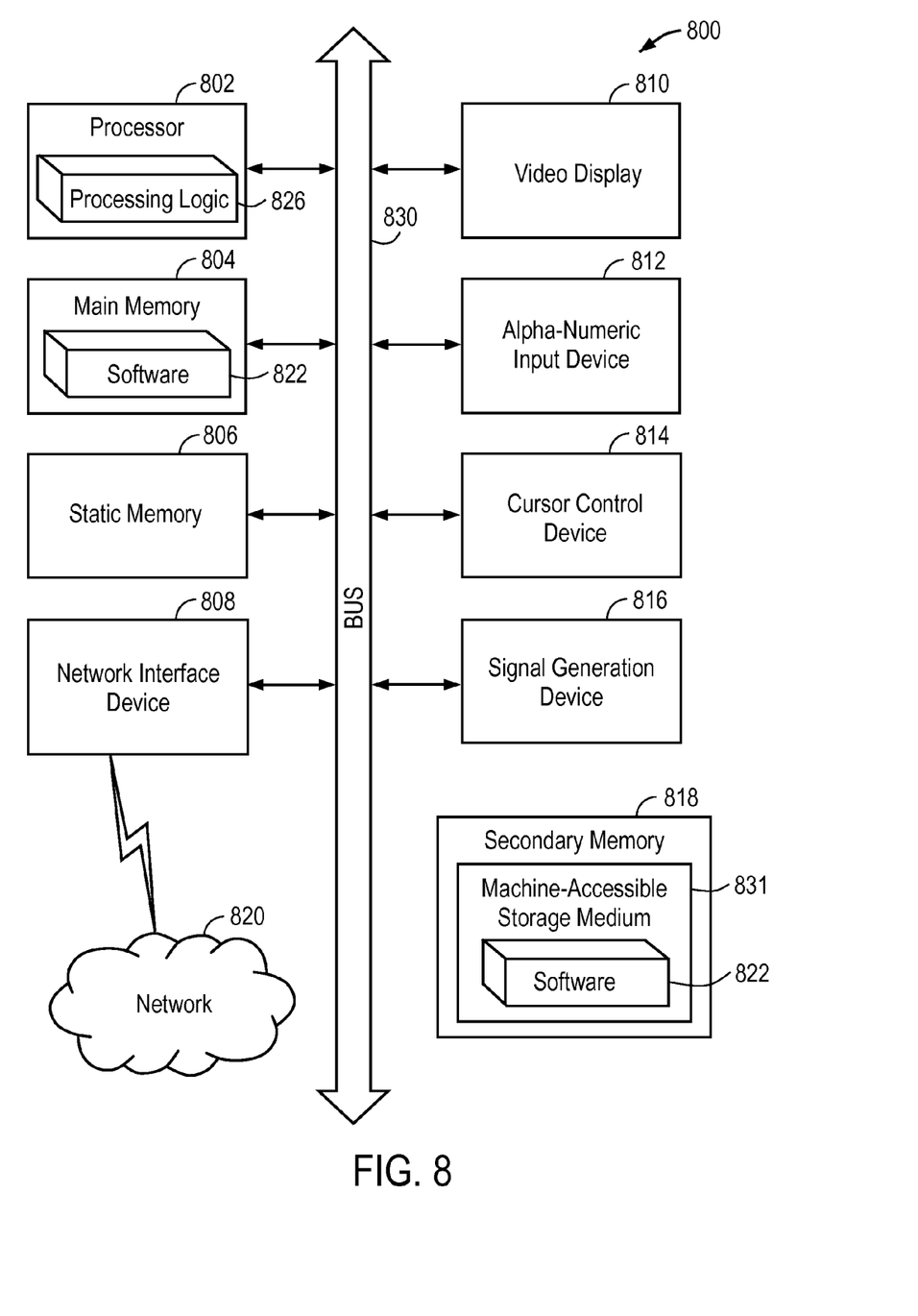
FIG. 8 illustrates a block diagram of an exemplary computer system, in accordance with an embodiment of the present invention.

FIG. 8 illustrates a diagrammatic representation of a machine in the exemplary form of a computer system 800 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 800 is suitable for use as computing device 712 described in association with FIG. 7.

The exemplary computer system 800 includes a processor 802, a main memory 804 (e.g., read-only memory (ROM), flash memory, dynamic random access memory (DRAM) such as synchronous DRAM (SDRAM) or Rambus DRAM (RDRAM), etc.), a static memory 806 (e.g., flash memory, static random access memory (SRAM), etc.), and a secondary memory 818 (e.g., a data storage device), which communicate with each other via a bus 830.

Processor 802 represents one or more general-purpose processing devices such as a microprocessor, central processing unit, or the like. More particularly, the processor 802 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 802 may also be one or more special-purpose processing devices such as an application specific integrated circuit (ASIC), a field programmable gate array (FPGA), a digital signal processor (DSP), network processor, or the like. Processor 802 is configured to execute the processing logic 826 for performing the operations discussed herein.

The computer system 800 may further include a network interface device 808. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), and a signal generation device 816 (e.g., a speaker).

The secondary memory 818 may include a machine-accessible storage medium (or more specifically a computer-readable storage medium) 831 on which is stored one or more sets of instructions (e.g., software 822) embodying any one or more of the methodologies or functions described herein. The software 822 may also reside, completely or at least partially, within the main memory 804 and/or within the processor 802 during execution thereof by the computer system 800, the main memory 804 and the processor 802 also constituting machine-readable storage media. The software 822 may further be transmitted or received over a network 820 via the network interface device 808.

While the machine-accessible storage medium 831 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Thus, electrostatic chucks with advanced RF and temperature uniformity, and methods of fabricating such electrostatic chucks, have been disclosed. In an embodiment, an electrostatic chuck (ESC) with advanced RF and temperature uniformity includes a top dielectric layer. An upper metal portion is disposed below the top dielectric layer. A second dielectric layer is disposed above a plurality of pixilated resistive heaters and surrounded in part by the upper metal portion. A third dielectric layer is disposed below the second dielectric layer, with a boundary between the third dielectric layer and the second dielectric layer. A plurality of vias is disposed in the third dielectric layer. A bus power bar distribution layer is disposed below and coupled to the plurality of vias. The plurality of vias electrically couples the plurality of pixilated resistive heaters to the bus bar power distribution layer. A fourth dielectric layer is disposed below the bus bar power distribution layer, with a boundary between the fourth dielectric layer and the third dielectric layer. A metal base is disposed below the fourth dielectric layer. The metal base includes a plurality of high power heater elements housed therein.

What is claimed is:

1. An electrostatic chuck (ESC) with advanced RF and temperature uniformity, the ESC comprising:
   a top dielectric layer;
   an upper metal portion disposed below the top dielectric layer;
   a second dielectric layer disposed above a plurality of pixilated resistive heaters and surrounded in part by the upper metal portion;
   a third dielectric layer disposed below the second dielectric layer, with a boundary between the third dielectric layer and the second dielectric layer;
   a plurality of vias disposed in the third dielectric layer;
   a bus power bar distribution layer disposed below and coupled to the plurality of vias, wherein the plurality of vias electrically couple the plurality of pixilated resistive heaters to the bus bar power distribution layer;
   a fourth dielectric layer disposed below the bus bar power distribution layer, with a boundary between the fourth dielectric layer and the third dielectric layer; and
   a metal base disposed below the fourth dielectric layer, wherein the metal base comprises a plurality of high power heater elements housed therein.

2. The ESC of claim 1, wherein the top dielectric layer comprises a plurality of surface features disposed therein.

3. The ESC of claim 2, wherein the surface features of the top dielectric layer provide cooling channels for the ESC.

4. The ESC of claim 1, wherein the top dielectric layer is configured for supporting a wafer or substrate thereon.

5. The ESC of claim 1, wherein the top dielectric layer comprises a spray dielectric material.

6. The ESC of claim 1, further comprising:
   a solid ceramic plate disposed on the top dielectric layer.

7. The ESC of claim 6, wherein the solid ceramic plate is configured for supporting a wafer or substrate thereon.

8. The ESC of claim 1, wherein the upper metal portion provides a guide for radio frequency (RF) waves.

9. The ESC of claim 1, further comprising:
   a bottom plate disposed below and welded to the metal base.

10. A method of fabricating an electrostatic chuck (ESC), the method comprising:
    installing high power heater elements into housings in a metal base;
    welding a bottom plate to the metal base to house the high power heater elements therein;
    forming a first dielectric layer on the metal base by plasma spray or arc anodizing;
    forming a metal layer on the first dielectric layer and forming a bus bar power distribution layer from the metal layer;
    forming a second dielectric layer on the bus bar power distribution layer and on exposed portions of the first dielectric layer;
    forming via holes in the second dielectric layer, exposing the bus bar power distribution layer;
    filling the via holes with metal to form a plurality of conductive vias;
    forming a plurality of pixilated resistive heaters disposed above and electrically coupled to the plurality of conductive vias;
    forming a third dielectric layer on the plurality pixilated resistive heaters;
    forming an upper metal portion on, and partially surrounding, the third dielectric layer; and
    forming a top dielectric layer on the upper metal portion.

11. The method of claim 10, wherein forming the top dielectric layer comprises using a plasma spray technique.

12. The method of claim 10, further comprising:
    machining a plurality of surface features in a top surface of the top dielectric layer.

13. The method of claim 10, further comprising:
    adhering a solid ceramic plate to the top dielectric layer.

14. An etching system, comprising:
    a chamber coupled to an evacuation device, a gas inlet device, a plasma ignition device, and a detector;
    a computing device coupled with the plasma ignition device;
    a voltage source coupled with a ample holder comprising an electrostatic chuck (ESC), the ESC disposed in the chamber and comprising:

a top dielectric layer;

an upper metal portion disposed below the top dielectric layer;

a second dielectric layer disposed above a plurality of pixilated resistive heaters and surrounded in part by the upper metal portion;

a third dielectric layer disposed below the second dielectric layer, with a boundary between the third dielectric layer and the second dielectric layer;

a plurality of vias disposed in the third dielectric layer;

a bus power bar distribution layer disposed below and coupled to the plurality of vias, wherein the plurality of vias electrically couple the plurality of pixilated resistive heaters to the bus bar power distribution layer;

a fourth dielectric layer disposed below the bus bar power distribution layer, with a boundary between the fourth dielectric layer and the third dielectric layer; and a metal base disposed below the fourth dielectric layer, wherein the metal base comprises a plurality of high power heater elements housed therein.

15. The etching system of claim 14, wherein the top dielectric layer of the ESC comprises a plurality of surface features disposed therein, wherein the surface features of the top dielectric layer provide cooling channels for the ESC.

16. The etching system of claim 14, wherein the top dielectric layer of the ESC is configured for supporting a wafer or substrate thereon.

17. The etching system of claim 14, wherein the top dielectric layer of the ESC comprises a spray dielectric material.

18. The etching system of claim 14, the ESC further comprising:

a solid ceramic plate disposed on the top dielectric layer, wherein the solid ceramic plate is configured for supporting a wafer or substrate thereon.

19. The etching system of claim 14, wherein the upper metal portion of the ESC provides a guide for radio frequency (RF) waves.

20. The etching system of claim 14, the ESC further comprising:

a bottom plate disposed below and welded to the metal base of the ESC.

\* \* \* \* \*

UNITED STATES PATENT AND TRADEMARK OFFICE
CERTIFICATE OF CORRECTION

PATENT NO. : 8,937,800 B2  
APPLICATION NO. : 13/867515  
DATED : January 20, 2015  
INVENTOR(S) : Dmitry Lubomirsky et al.

Page 1 of 1

It is certified that error appears in the above--identified patent and that said Letters Patent is hereby corrected as shown below:

On the Title Page

Item 57 in the abstract, line 5, delete "pixilated" and insert -- pixelated --

In the Specification

In column 3, line 36, delete "pixilated" and insert -- pixelated --

In column 3, line 41, delete "pixilated" and insert -- pixelated --

In column 4, line 8, delete "pixilated" and insert -- pixelated --

In column 4, line 14, delete "pixilated" and insert -- pixelated --

In column 7, line 37, delete "pixilated" and insert -- pixelated --

In column 7, line 44, delete "pixilated" and insert -- pixelated --

In the Claims

In claim 1, column 7, line 60, delete "pixilated" and insert -- pixelated --

In claim 1, column 8, line 1, delete "pixilated" and insert -- pixelated --

In claim 10, column 8, line 45, delete "pixilated" and insert -- pixelated --

In claim 10, column 8, line 48, delete "pixilated" and insert -- pixelated --

In claim 14, column 9, line 5, delete "pixilated" and insert -- pixelated --

In claim 14, column 9, line 13, delete "pixilated" and insert -- pixelated --

Signed and Sealed this  
Twelfth Day of July, 2016

Michelle K. Lee  
*Director of the United States Patent and Trademark Office*